(12) United States Patent  (10) Patent No.: US 7,720,122 B2
Matsushita et al.  (45) Date of Patent: May 18, 2010

(54) SEMICONDUCTOR LASER DEVICE AND SEMICONDUCTOR LASER ASSEMBLY

(75) Inventors: Koichi Matsushita, Kanagawa-ken (JP); Masanori Yamada, Kanagawa-ken (JP); Hironobu Miyasaka, Kanagawa-ken (JP); Kazuya Tsunoda, Kanagawa-ken (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 616 days.

(21) Appl. No.: 11/111,969

(22) Filed: Apr. 22, 2005

(65) Prior Publication Data

US 2005/0238074 A1 Oct. 27, 2005

(30) Foreign Application Priority Data

Apr. 26, 2004 (JP) ............................. 2004-129634

(51) Int. Cl.
*H01S 3/04* (2006.01)
(52) U.S. Cl. .................................... 372/43.01; 372/36
(58) Field of Classification Search ............. 372/43.01, 372/36
See application file for complete search history.

(56) References Cited

U.S. PATENT DOCUMENTS

| 4,851,902 | A | * | 7/1989 | Tezuka et al. | 348/126 |
| 5,291,038 | A | * | 3/1994 | Hanamoto et al. | 257/82 |
| 5,614,735 | A | | 3/1997 | Kitamura et al. | |
| 6,038,203 | A | * | 3/2000 | Tajiri et al. | 369/112.1 |
| 2003/0031429 | A1 | * | 2/2003 | Okayasu et al. | 385/92 |
| 2003/0231672 | A1 | | 12/2003 | Komoto | |

* cited by examiner

*Primary Examiner*—Minsun Harvey
*Assistant Examiner*—Patrick Stafford
(74) *Attorney, Agent, or Firm*—Banner & Witcoff, Ltd

(57) ABSTRACT

Semiconductor laser assembly 1 is provided with semiconductor laser device 6 and heat dissipation member 24. Semiconductor laser device 6 includes semiconductor laser element 15, lead-frame 11, lower and upper enclosures 18 and 19 and plate-like spring 21 connected to lead-frame 11. Semiconductor laser element 15 is mounted on lead-frame 11 through sub-mounting member 16. Lower and upper enclosures 18 and 19 have an opening through which laser beams from semiconductor laser element 15 are emitted. Plate-like spring 21 is connected to lead-frame 11 and has wing and holding portions 22 and 23. Holding portion 23 is a C-character in cross section to put lower and upper enclosures 18 and 19 together. Heat dissipation member 24 has inside walls to define perforation 25, so that wing portions 22 of plate-like spring 21 pushes semiconductor laser device 6 against the inside walls of heat dissipation member 24 when the semiconductor laser device 6 is set in perforation 25.

21 Claims, 15 Drawing Sheets

SEMICONDUCTOR LASER DEVICE AND SEMICONDUCTOR LASER ASSEMBLY

CROSS-REFERENCE TO RELATED APPLICATION

This application is based upon and claims the benefit of priority from the prior Japanese Patent Application No. 2004-129634, filed on Apr. 26, 2004, the entire contents of which are incorporated herein by reference.

FIELD OF THE INVENTION

This invention generally relates to a semiconductor laser device and a semiconductor laser assembly capable of receiving, and stably dissipating heat from, a semiconductor laser device.

RELATED ART

A semiconductor laser device in which a semiconductor laser element is packaged has heat dissipating paths sufficiently secured to suppress a temperature rise due to the generation of heat at its operation. When an optical pick-up device is assembled with such a semiconductor laser device, it is necessary to have a structure for heat dissipation paths through which heat is dissipated from the semiconductor laser device to the exterior.

A conventional semiconductor laser device was assembled in a can type package in which a semiconductor laser element is mounted on a metal stem through a sub-mounting member and is covered with a metal cap and the metal stem and the metal cap are put together with sealant. In order to comply with demands for small and thin electronic equipment, it has recently come into wide use to apply a lead-frame type package to a semiconductor laser device in which a semiconductor laser element is mounted on a lead-frame through a sub-mounting member.

As schematically shown in FIG. 14, lead-frame type semiconductor laser device 106 is primarily composed of chip-like semiconductor laser element 115, light-receiving element (not shown), lead-frame 111 and lower and upper enclosures 118 and 119. Chip-like semiconductor laser element 115 is disposed on sub-mounting member 116 to emit a laser while the light-receiving element monitors the laser emitted from semiconductor laser element 115. Semiconductor laser element 115 and the light-receiving element are mounted on lead-frame 111. Lower and upper enclosures 118 and 119 cover the circumferences of semiconductor laser element 115 and the light-receiving element. Connecting leads 112 extend in the direction opposite to that of laser emission. Such a lead-frame type semiconductor laser device is disclosed on page 3, FIG. 1 in Japanese Unexamined Patent Publication 2003-31885, for instance. Since semiconductor laser element 115 is a dual-wavelength lasing-type monolithic-semiconductor laser element, semiconductor laser device 106 has four connecting leads 112.

SUMMARY OF THE INVENTION

A first aspect of the present invention is directed to a semiconductor laser device provided with a semiconductor laser element, a lead-frame on which the semiconductor laser element is provided, an enclosure with an opening to emit laser beams from the semiconductor laser element contained in the enclosure, and a spring connected to the lead-frame.

A second aspect of the present invention is directed to a semiconductor laser assembly provided with a semiconductor laser device and a heat dissipation member. The semiconductor laser device includes a semiconductor laser element, a lead-frame on which the semiconductor laser element is mounted, an enclosure with an opening through which laser beams from the semiconductor laser element are emitted and a spring connected to the lead-frame. The heat dissipation member has inside walls to define a perforation, so that the spring pushes the semiconductor laser device against the inside walls of the heat dissipation member when the semiconductor laser device is set in the perforation.

Another aspect of the present invention is directed to a semiconductor laser assembly provided with a semiconductor laser device containing a semiconductor laser element, a lead-frame on which the semiconductor laser element is mounted, and an enclosure having an opening through which laser beams from the semiconductor laser are emitted, and a heat dissipation member which has inside walls to define a perforation. An outer surface of the enclosure of the semiconductor laser device and one of the inside walls corresponding to the outer surface of the enclosure of the semiconductor laser device are sloped so that the heat dissipation member holds the semiconductor laser device when the semiconductor laser device is set in the perforation.

BRIEF DESCRIPTION OF THE DRAWINGS

A more complete appreciation of the present invention and many of its attendant advantages will be readily obtained as the same becomes better understood by reference to the following detailed descriptions when considered in connection with the accompanying drawings, wherein.

DESCRIPTION OF THE EMBODIMENTS

Figure 15:
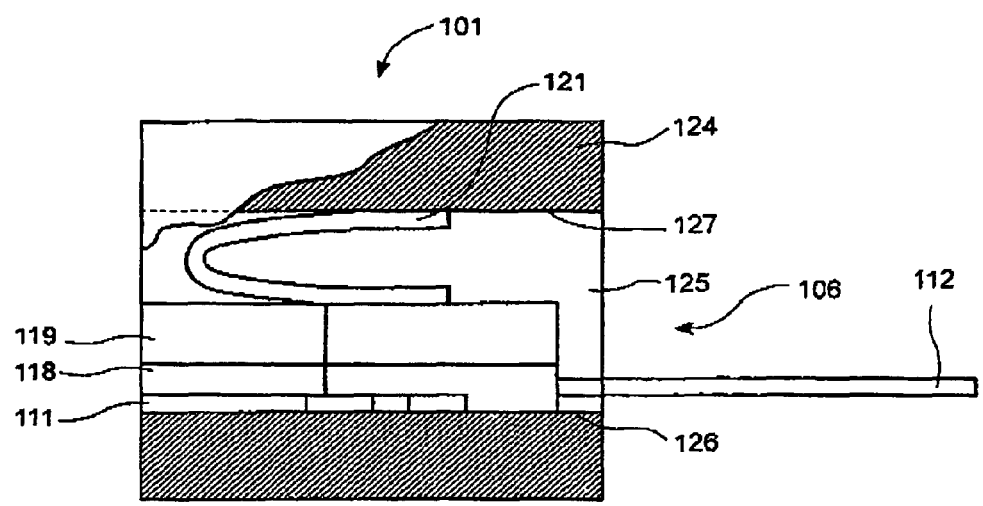
FIG. 15 is a schematic side view of a semiconductor laser assembly and its sectional view partially cut out along a heat dissipation member.

When semiconductor laser device 106 is used for an optical pick-up component, for example, metal heat dissipation members with a larger heat capacity are usually added to make up an assembled structure (hereinafter called a semiconductor laser assembly). FIG. 15 is a side view of semiconductor laser assembly 101 with a sectional view partially cut-out along the longitudinal direction of lead-frame 111.

As shown in FIG. 15, semiconductor laser assembly 101 receives semiconductor laser device 106 at a predetermined place in space or perforation 125 defined in heat dissipation member 124 and has plate-like folded spring 121 inserted between upper inside wall 127 and upper enclosure 119 to elastically support semiconductor laser device 106 between lower and upper inside walls 126 and 127 in space 125. The structure of semiconductor laser assembly 101 secures heat dissipation paths primarily by means of heat conduction through the metal walls. At the same time, the strength of the members enclosed by heat dissipation member 124 is enhanced so that semiconductor laser device 106 can be easily handled in subsequent assembling processes.

It takes time, however, to pick up plate-like folded spring 121 and to put the same between upper inside wall 127 and upper enclosure 119 with a pair of tweezers. When plate-like folded spring 121 is disposed out of a predetermined position even after such time consuming manipulations, lower inside wall 126 of heat dissipation member 124 is not sufficiently contacted with lead-frame 111, so that the temperature of semiconductor laser element 115 rises up more than its limit, the optical pick-up component doses not perform well, or malfunctions, such as short operation life, may take place.

Embodiments of the present invention will be explained below with reference to the attached drawings. It should be noted that the present invention is not limited to the embodiments but covers their equivalents. Throughout the attached drawings, similar or same reference numerals show similar, equivalent or same components.

First Embodiment

Figure 1A:
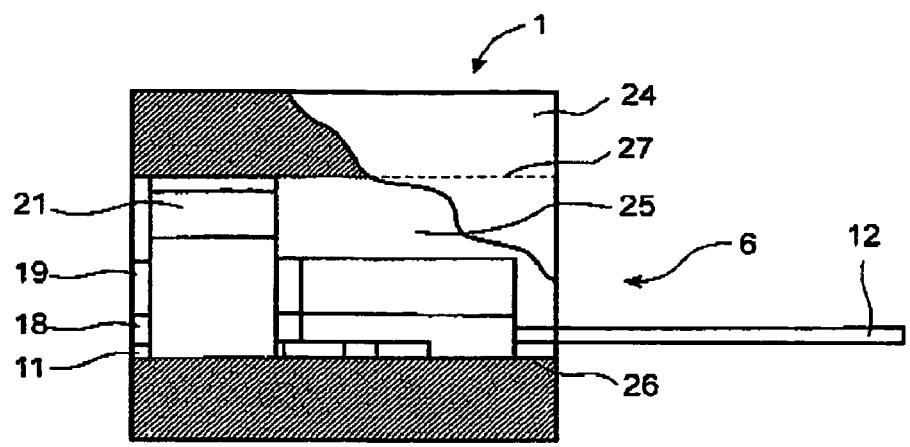
FIG. 1A is a schematic side view of a semiconductor laser assembly and its sectional view partially cut out along a heat dissipation member according to a first embodiment of the present invention.
Figure 1B:
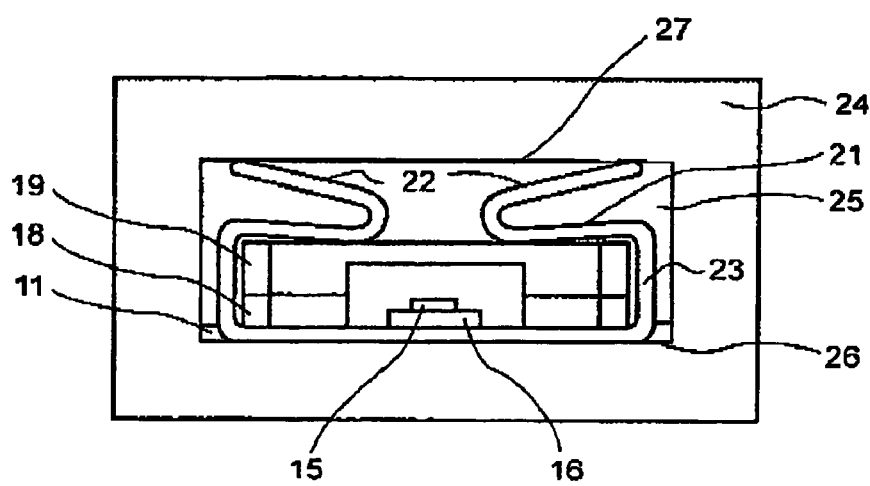
FIG. 1B is a front view of the semiconductor laser assembly shown in FIG. 1A.
Figure 2A:
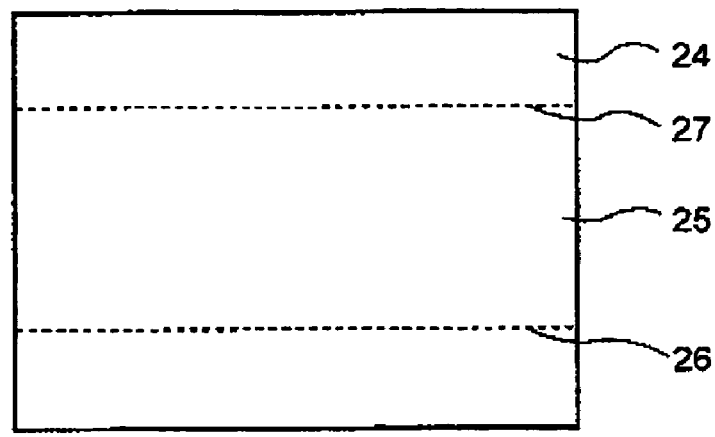
FIG. 2A is a side view of a heat dissipation member in the first embodiment of the present invention.
Figure 2B:
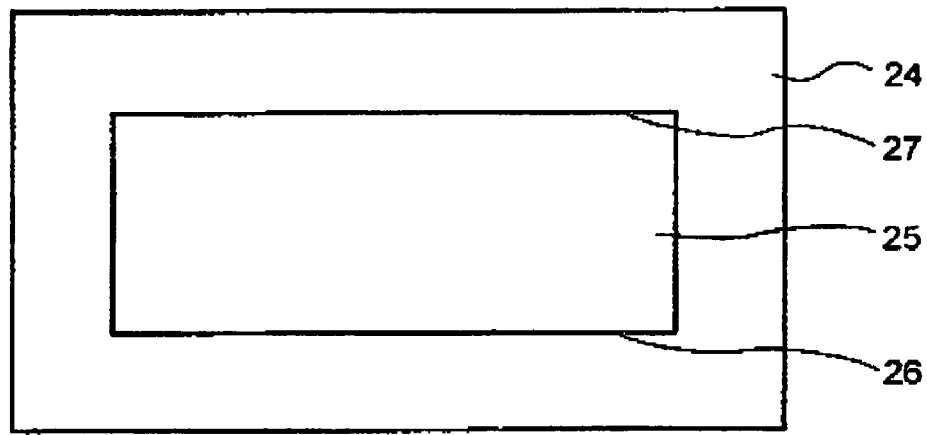
FIG. 2B is a front view of the heat dissipation member shown in FIG. 2A.
Figure 3A:
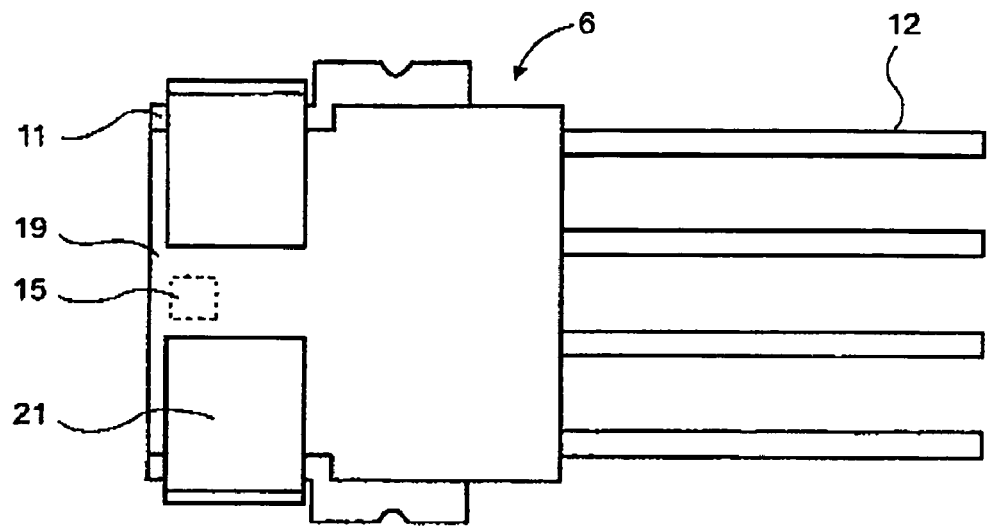
FIG. 3A is a plan view of a semiconductor laser device of a second embodiment of the present invention.
Figure 3B:
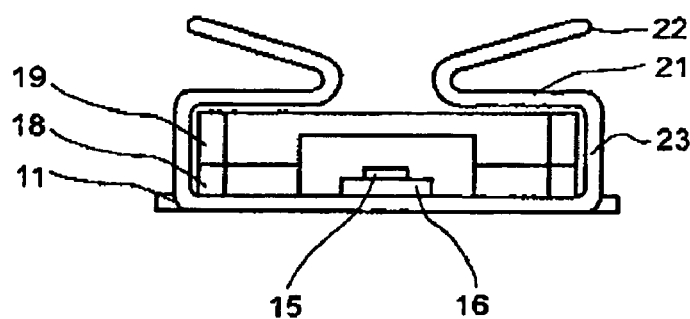
FIG. 3B is a front view of the semiconductor laser device shown in FIG. 3A.

A semiconductor laser device and a semiconductor laser assembly in accordance with a first embodiment of the present invention are described below with reference to FIGS. 1A through FIG. 3B. FIG. 1A is a schematic side view of a semiconductor laser assembly and its sectional view partially cut out along a heat dissipation member according to a first embodiment of the present invention. FIG. 1B is a front view of the semiconductor laser assembly shown in FIG. 1A. FIG. 2A is a side view of a heat dissipation member in the first embodiment of the present invention. FIG. 2B is a front view of the heat dissipation member in the first embodiment of the present invention. FIG. 3A is a plan view of a semiconductor laser device of a second embodiment of the present invention. FIG. 3B is a front view of the semiconductor laser device shown in FIG. 3A.

As shown in FIGS. 1A and 1B, semiconductor laser assembly 1 is provided with semiconductor laser device 6 and heat dissipation member 24. Heat dissipation member 24 is substantially cubic in external shape and has rectangular perforation 25 in cross section to receive whole semiconductor laser device 6 except extended connecting leads 12. Semiconductor laser device 6 includes upper enclosure 19 and plate-like spring member 21 which is connected to lead-frame 11 and has wing portions 22 provided on the outer surface of upper enclosure 19 and holding portion 23 with a C-character in cross section to hold lower and upper enclosures 18 and 19. Repulsion of wing portions 22 of plate-like spring member 21 compressively holds semiconductor laser device 6 while rectangular perforation 25 receives semiconductor laser device 6. A laser emitted from semiconductor laser device 6 is emitted toward the left direction in FIG. 1A, i.e., the direction opposite to that of connecting leads 12.

As shown in FIGS. 2A and 2B, heat dissipation member 24 is an external metal heat radiator, for example, which is larger in heat capacity than semiconductor laser device 6 and which is substantially cubic in appearance. Cubic heat dissipation member 24 has rectangular perforation 25 with front and rear apertures. Flat bottom and upper surfaces 26 and 27 of the inside walls elastically receive lead-frame 11 and plate-like spring 21, respectively. The wall thickness of heat dissipation member 24 measured between the outer and inner surfaces of the inside walls ranges from 1 mm to 2 mm but may be thinner or thicker than that depending on installing environment, requirements or the like for semiconductor laser device 6.

Perforation 25 of heat dissipation member 24 is slightly bigger in size than semiconductor laser device 6 with lead-frame 11 in contact with bottom surface 26 and with connecting leads 12 largely extended from heat dissipation member 24 when lead-frame 11 and lower and upper enclosures 18 and 19 are received in perforation 25. The rectangular apertures are wide enough to receive the maximum width of lead-frame 11 while their heights are lower by 0.5 mm, for example, than the height measured between lead-frame and plate-like spring member 21.

As shown in FIGS. 3A and 3B, semiconductor laser device 6 is provided with semiconductor laser element 15, sub-mounting member 16, lead-frame 11, lower and upper enclosures 18 and 19, connecting leads 12 and plate-like spring 21. Semiconductor laser element 15 is mounted on sub-mounting member 16 made of a high heat conductivity material, such as aluminum nitride, to emit a chip-like laser. The laser is monitored by an optically receiving element (not shown). Lead-frame 11 to which semiconductor laser element 15 and the optically receiving element are connected is made of a copper or iron system material. Lower and upper enclosures 18 and 19 are molded out of resin to enclose semiconductor laser element 15 and the optically receiving element together. Connecting leads 12 are extended from lower enclosure 18 to the outside in the direction opposite to that of the emitting laser. Lead-frame 11 is connected to plate-like spring 21.

Lead-frame 11 is the same in width as lower enclosure 18 or slightly wider. Semiconductor laser element 15 is mounted at the central place on the edge portion opposite to connecting leads 12, i.e., on the left-side edge portion shown in FIG. 3A. Lower enclosure 18 provided on lead-frame 11 and upper enclosure 19 enclose semiconductor laser element 15 and the optically receiving element but have an opening for semiconductor laser element 15 to emit a laser toward the left-side shown in FIG. 3A.

Semiconductor laser element 15 and the optically receiving element are electrically connected to connecting leads 12. Here, since semiconductor laser element 15 is a dual-wavelength lasing-type monolithic device, four connecting leads 12 are provided for the connection of semiconductor laser element 15, As shown in FIG. 3, plate-like spring 21 is provided at the edge portion on the mounting side of semiconductor laser element 15 opposite to that of connecting leads 12. Wing portions 22 of plate-like spring 21 are inclined with respect to the plane of lead-frame 11. Holding portion 23 of plate-like spring 21 is extended from lead-frame 11, is bent along the outer surfaces of lower and upper enclosures 18 and 19, and is folded to direct wing portions 22 to the upper right and left at inside points apart from the outer surface of the side walls of upper enclosure 19 by about ⅔ of its width.

Figure 5A:
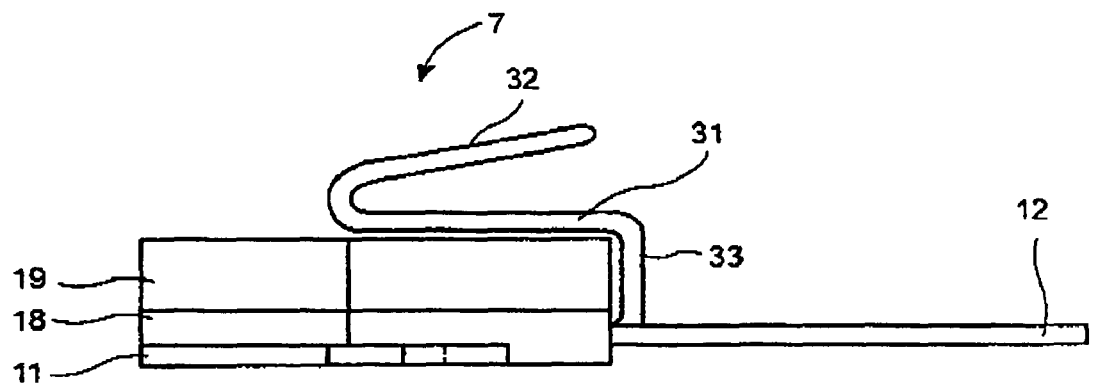
FIG. 5A is a side view of a semiconductor laser device according to the second embodiment of the present invention.
Figure 5B:
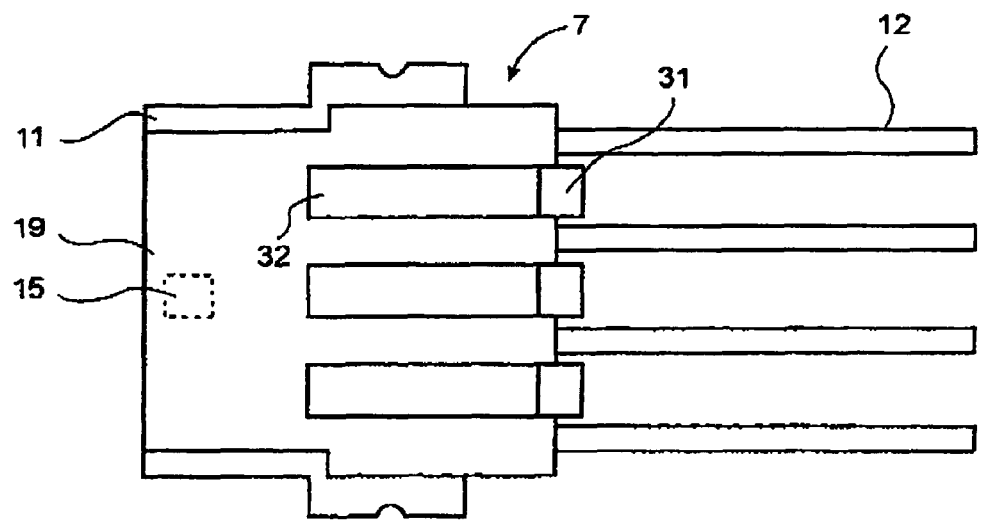
FIG. 5B is a plan view of the semiconductor laser device shown in FIG. 5A.

A slight gap is defined between the inner side and upper walls of plate-like spring 21 and the outer surfaces of lower and upper enclosures 18 and 19. The maximum width of plate-like spring 21, i.e., the length measured from the right edge to the left edge shown in FIG. 5B, is slightly narrower than that of lead-frame 11. The edge portions of plate-like spring 21 are shaped to be round, for instance. The height measured from the outer bottom surface of lead-frame 11 to the upper edges of plate-like spring 21 is designed to make the compressed length of plate-like spring 21 about 0.5 mm, for example, when plate-like spring 21 is assembled with heat dissipation member 24.

Next, an assembling method of semiconductor laser assembly 1 will be described below. Semiconductor laser device 6 and heat dissipation member 24 are prepared. Plate like spring 21 and lead-frame 11 of semiconductor laser device 6 are picked up with a pair of tweezers with wide front edges (not shown) and inserted into rectangular perforation 25 while plate-like spring 21 is kept compressed. While the front portion of semiconductor laser device 6 is held in rectangular perforation 25, the tweezers are removed from semiconductor laser device 6 and semiconductor laser device 6 is further pushed into a predetermined position in rectangular perforation 25. Since the edge portions of lead-frame 11 are round, the upper edge portions of plate-like spring 21, the bottom surface of lead-frame 1L, etc., are smoothly movable while contacting with the inside walls of heat dissipation member 24.

A resin adhesive may be applied to fix semiconductor laser device 6 at such a predetermined position in rectangular perforation 25. A pair of tweezers with clearance stoppers (not shown) may also be used not to excessively compress plate-like spring 21 but to maintain proper clearance defined between the tweezers in the case that plate-like spring 21 is not stably manipulated with a pair of ordinary tweezers by adjusting holding force applied to them.

Semiconductor laser assembly 1 is assembled in accordance with the method set forth above. AB shown in FIGS. 1A and 1B, wing portions 22 of plate-like spring 21 are elastically in contact with the upper inside wall of heat dissipation member 24. An upper part of plate-like spring 21 presses the outer surface of upper enclosure 19 of semiconductor laser device 6. Repulsion of plate-like spring makes lead-frame 11 in close contact with the inside bottom wall of heat dissipation member 24.

Operation evaluations of semiconductor laser assembly 1 have been carried out in comparison with those of a conventional semiconductor laser assembly. The conventional semiconductor laser assembly is composed of a semiconductor laser device, a separate component of such a plate-like spring as shown in FIG. 15 and heat dissipation member 24. The semiconductor laser device is elastically fixed with the plate like spring in heat dissipation member 24. Comparison results have shown that electric-current-optical-output characteristics of semiconductor laser assembly 1 are comparable with those of the conventional semiconductor laser assembly 1. More than 1,000 units of semiconductor laser assembly 1 made and evaluated at the same time have stably brought about the same results.

As described above, semiconductor laser assembly 1 includes plate-like spring 21 extended from lead-frame 11 and the repulsion of wing portions 22 of plate-like spring 21 presses to elastically hold semiconductor laser device 6 in heat dissipation member 24. Thus, a heat dissipation path is firmly defined between lead-frame 11 and heat dissipation member 24, so that heat dissipation characteristics can be stabilized. Since plate-like spring 21 and lead-frame 11 are made out of the same metal plate, it is unnecessary to prepare a separate component of a plate-like spring, so that a process for incorporating plate-like spring 21 in a lead-frame 11 can be omitted. In addition, plate-like spring 21 is not lost nor shifts its position with respect to lead-frame 11. Thus, the process for assembling a semiconductor laser assembly can be significantly simplified.

Second Embodiment

Figure 4:
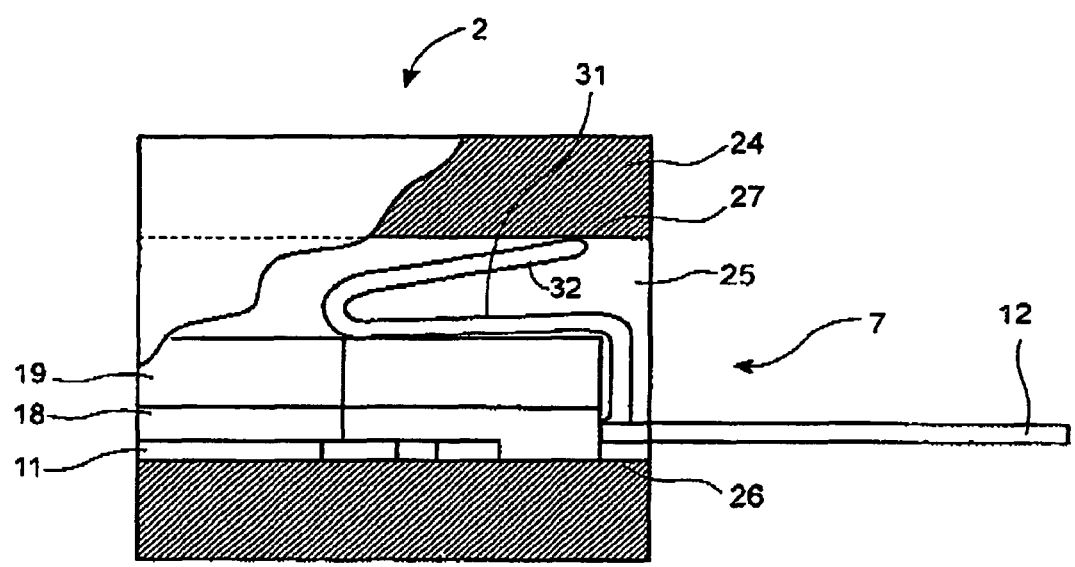
FIG. 4 is a schematic side view of a semiconductor laser assembly and its sectional view partially cut out along a heat dissipation member according to the second embodiment of the present invention.
Figure 5C:
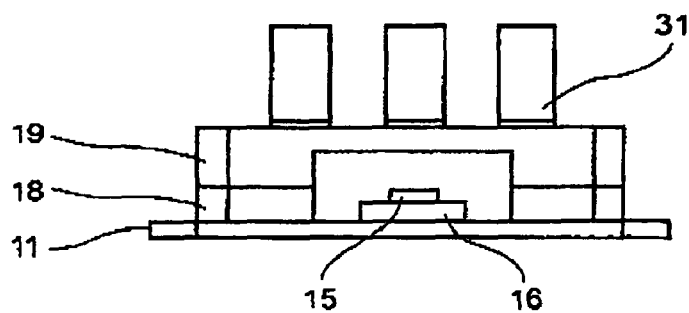
FIG. 5C is a front view of the semiconductor laser device shown in FIG. 5A.

A semiconductor laser device and a semiconductor laser assembly in accordance with the second embodiment will be described with reference to FIGS. 4 and 5A-5C. FIG. 4 is a schematic side view of semiconductor laser assembly 2 and its sectional view partially cut out along heat dissipation member 24, respectively. FIGS. 5A-5C are side, plan and front views of semiconductor laser device 7, respectively. Semiconductor laser device 7 differs from semiconductor laser device 6 in arrangements for plate-like spring 31: its locations, bent directions and the number of its pieces. Since heat dissipation member 24 is the same as in the first embodiment, semiconductor laser assembly 2 differs from semiconductor laser assembly 1 for the most part in the arrangements for plate-like spring 31 of semiconductor laser device 7. Same reference numerals are put on the same components of semiconductor laser assembly 2 as those of semiconductor laser assembly 1 and descriptions about them are omitted.

As shown in FIG. 4, semiconductor laser assembly 2 elastically receives semiconductor laser device 7 with plate-like springs 31 in rectangular perforation 25 of heat dissipation member 24. Connecting leads 12, however, extend from heat dissipation member 24. Plate-like springs 31 have wing portions 32 provided over upper enclosure 19 and leg portions 33. Leg portions 33 are extended from lead-frame 11 to wing portions 32 along the outer surfaces of upper enclosure 19. Wing portions 32 are folded from the leg portions 33 to make wing 32 and leg portions 33 character C-like in cross-section. Repulsion of wing portions 32 of plate-like springs 31 pushes lead-frame 11 onto the inside bottom wall of heat dissipation member 24 while semiconductor laser assembly 2 receives semiconductor laser device 7. A laser is emitted from semiconductor laser device 7 to the direction opposite to that of connecting leads 12.

As shown in FIGS. 5A and 5B, three plate-like springs 31 of semiconductor laser device 7 are extended from, and at right angles to, lead-frame 11 on the side of connecting leads 12 and are bent at the corner and along the outer surface of upper enclosure 19 to form wing and leg portions 32 and 33. Plate-like springs 31, however, are made not to contact with connecting leads 12.

As shown in FIG. 5A, a slight gap is provided between plate-like springs 31 and lower and upper enclosures 18 and 19 up to the folded portions of plate-like springs 31. Wing portions 32 are upwardly extended but their edges are not beyond the plane extending from the outer edge surfaces of lower and upper enclosures 18 and 19. The upper edges of plate-like springs 31 are made round, for example. Plate-like springs 31 is compressed to 0.5 mm in height, for example, when semiconductor laser device 7 is set in heat dissipation member 24 of semiconductor laser assembly 2.

A method of assembling semiconductor laser assembly 2 is substantially the same as that of assembling semiconductor laser assembly 1: plate-like springs 31 and lead-frame 11 of semiconductor laser device 7 are picked up with a pair of tweezers with wide front edges (not shown) and set in rectangular perforation 25 of heat dissipation member 24 while plate-like springs 31 are kept compressed, as described above. When semiconductor laser device 7, however, is inserted into rectangular perforation 25 from the laser emission side, tools, such as a pair of tweezers, may be unnecessary for the assembling of semiconductor laser assembly 2.

As shown in FIG. 4, wing portions 32 of plate-like springs 31 of semiconductor laser assembly 2 assembled by the method set forth above pushes upper inner surface 27 of heat dissipation member 24. At the same time, wing portions 32 of plate-like springs 31 presses upper enclosure 19. Thus, repulsion of plate-like springs 31 make the bottom surface of lead-frame 11 come in contact with the inside bottom surface 26 of heat dissipation member 24.

In addition to having the same advantages as semiconductor laser assembly 1, although other portions than lead-frame 11 in parallel with connecting leads 12 were discarded, semiconductor laser assembly 2 now can make effective use of them for plate-like springs 31.

Third Embodiment

Figure 6:
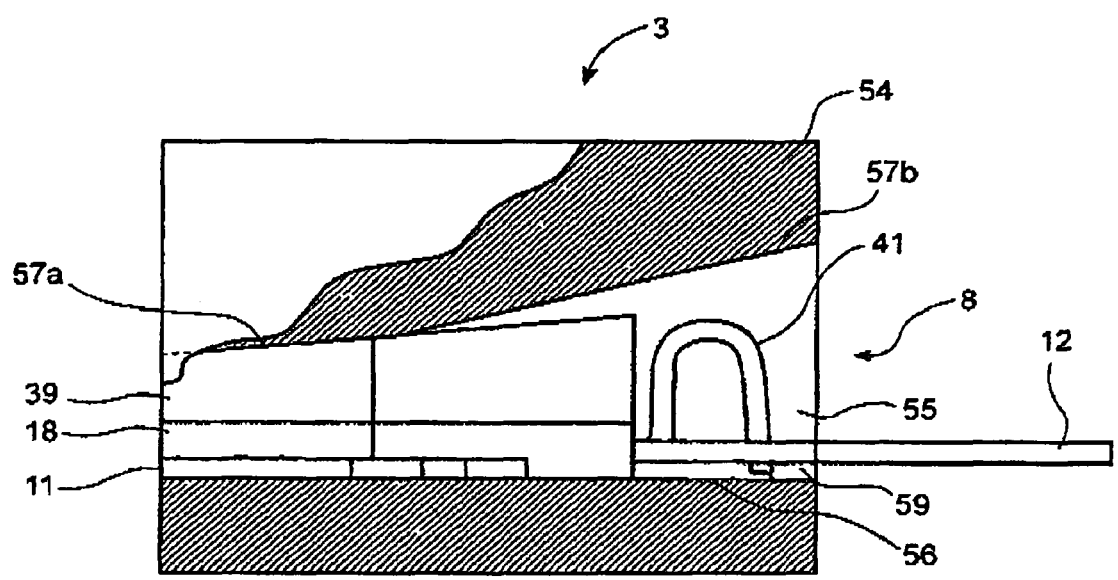
FIG. 6 is a schematic side view of a semiconductor laser assembly and its sectional view partially cut out along a heat dissipation member according to a third embodiment of the present invention.
Figure 7A:
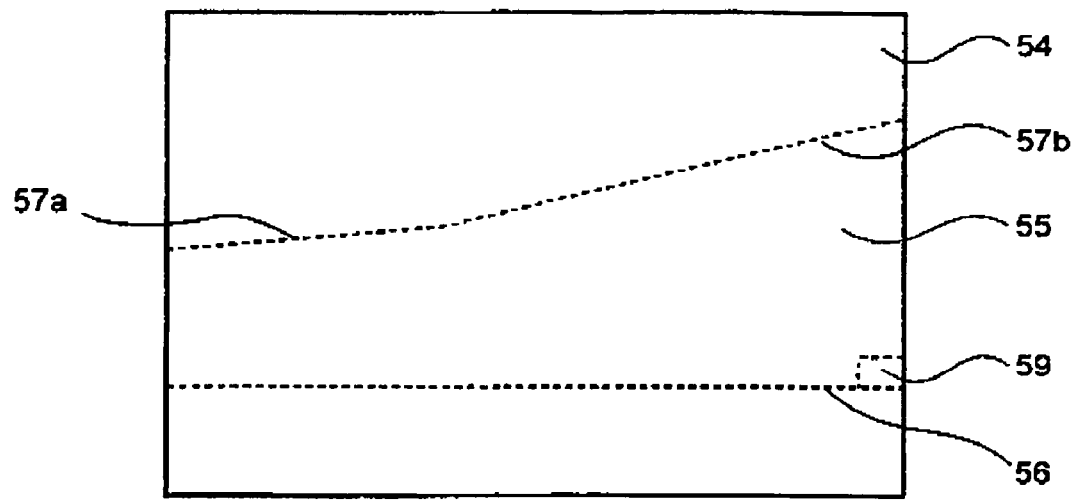
FIG. 7A is a side view of the heat dissipation member according to the third embodiment of the present invention.
Figure 7B:
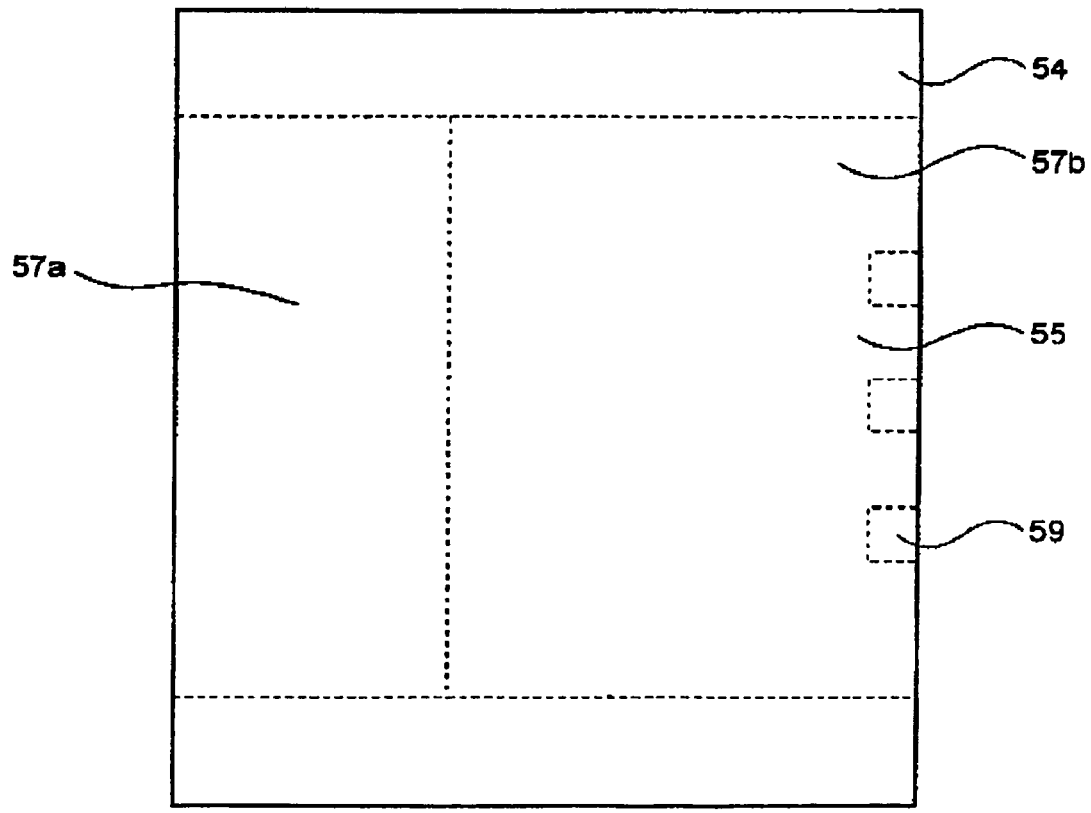
FIG. 7B is a plan view of the heat dissipation member shown in FIG. 7A.
Figure 8A:
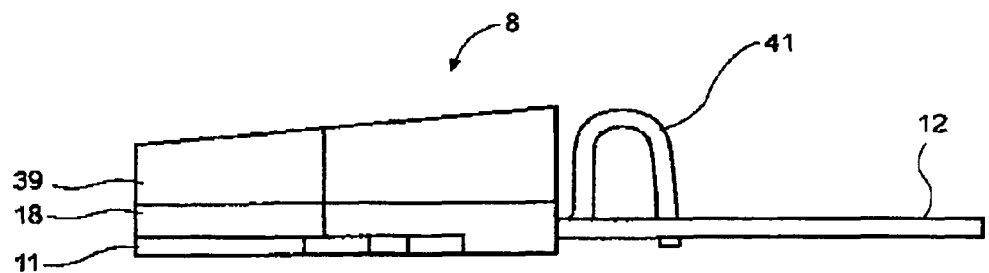
FIG. 8A is a side view of a semiconductor laser device according to the third embodiment of the present invention.
Figure 8B:
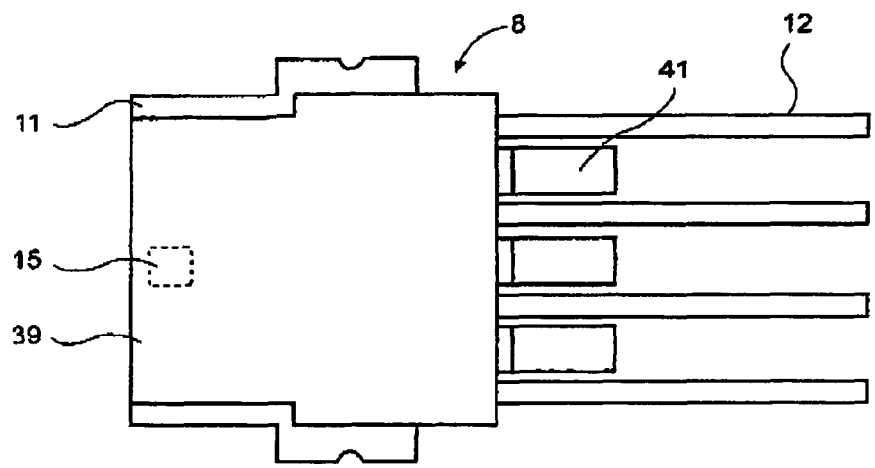
FIG. 8B is a plan view of the semiconductor laser shown in FIG. 8A.

A semiconductor laser device and a semiconductor laser assembly in accordance with the third embodiment will be described with reference to FIGS. 6, 7A-7B and 8A-8B. FIG. 6 is a schematic side view of semiconductor laser assembly 3 and its sectional view partially cut out along heat dissipation member 54. FIGS. 7A and 7B are side and plan views of heat dissipation member 54, respectively. FIGS. 8A and 8B are also side and plan views of semiconductor laser device 8, respectively. Semiconductor laser device 8 differs from first or second embodiment semiconductor laser device 6 or 7 in arrangements for plate-like springs 41: their locations, bent directions and the number of their pieces. Composite rectangular perforation 55 of heat dissipation member 54 also differs from that of first or second embodiment heat dissipation member 24 in shape, i.e., perforation 25, so that semiconductor laser assembly 3 is slightly bigger in size than semiconductor laser assembly 1 or 2. Same reference numerals are put on substantially the same components of semiconductor laser assembly 3 as those of first or second embodiment semiconductor laser assembly 1 or 2 and descriptions about them are omitted.

As shown in FIG. 6, semiconductor laser assembly 3 is provided with semiconductor laser device 8 having plate-like springs 41, and heat dissipation member 54 in which cubic perforation 55 is defined to receive all semiconductor laser device 8 except connecting lead 12 extending from heat dissipation member 54. Dissipation member 54 has inside top, side and bottom walls to define perforation 55. The inside top wall has gentle and steep slope planes 57a and 57b while inside bottom plane 56 is flat. Plate-like springs 41 which are a reverse U-character in cross section are formed at the outside of upper enclosure 39 on the side of connecting leads 12. Repulsion of plate-like springs 41 pushes a sloped top surface of upper enclosure 39 of semiconductor laser device 8 into gentle slop plane 57a (the middle and left-side in FIG. 6) of the inside top wall of heat dissipation member 54 and its reaction makes lead-frame 11 of semiconductor laser device 8 come in contact with inside bottom plane 56 of the inside bottom wall of dissipation member 54. The laser emission direction is to the left and on the reverse direction with respect to connecting leads 12 shown in FIG. 6.

As shown in FIGS. 7A and 7B, heat dissipation member 54 is a metal heat radiator which has a large heat capacity in comparison with semiconductor laser device 8. Heat dissipation member 54 is substantially cubic in appearance. Perforation 55 is provided in heat dissipation member 54 with rectangular apertures at its entrance and exit. As shown in FIG. 7A, two sides of the aperture at the exit (the left end) are the same in height as the laser emission edge portion defined by lead-frame 11 and lower and upper enclosures 18 and 39 while those of the aperture at the entrance (the right end) are higher than those at the exit by 1-2 mm, for instance, on the side of connecting leads 12 defined by lead-frame 11 and lower and upper enclosures 18 and 39. Those heights may be changed in accordance with the size of semiconductor laser device 8.

Heat dissipation member 54 is provided with inside top walls of gentle and steep slope planes 57a and 57b (the left and right-side shown in FIG. 7A, respectively). Gentle slope plane 57a is the same in slope as the outer edge slope surface of upper enclosure 39 but steep slope plane 57b is steeper in slope than gentle slope plane 57a. The boundary between gentle and steep slope planes 57a and 57b exists in the inside from the aperture at the exit (to the left direction) which is ⅓-½ of the length of heat dissipation member 54 measured along the extending direction of connecting leads 12. Inside bottom plane 56 is generally flat but provided with protrusions 59 at edge portions of the entrance aperture, i.e., at right-edge portions, to hold plate-like springs 41 when semiconductor laser assembly 3 is assembled The thickness of heat dissipation member 54 measured from the top outer surface to the inside top wall ranges 1-3 mm but may be changed to comply with requirements to receive semiconductor laser assembly 3 in use.

The size of heat dissipation member 54 measured between the entrance and exit apertures is enough to receive lead-frame 11, lower and upper enclosures 18 and 89 and plate-springs 41 while all semiconductor laser device 8 except the extending portions of connecting leads 12 is set in perforation 55 of heat dissipation member 54 with read-frame 11 kept in contact with inside bottom plane 56.

As shown in FIGS. 8A and 8B, resin molded and cap-like upper enclosure 39 is substituted for upper enclosure 19 of the first embodiment. Upper enclosure 39 has a slope top surface which is provided opposite to lead-frame 11 with respect to laser element 15 and which is higher in height on the side of plate-like spring 41 and lower in height on the laser emission side. Plate-like springs 41 which are reverse U-characters in cross section are substituted for plate-like spring 21 of the first embodiment. Plate-like springs 41 are connected with lead-frame 11 and provided at the outside of lower and upper enclosures 18 and 39 on the side of connecting leads 12.

As shown in FIGS. 8A and 8B, plate-like springs 41 with three-parallel pieces are upright from lead-frame 11 of semiconductor laser device 8 and folded to be the same in height as the outer (top) surface of upper enclosure 39 but no legs of plate-like springs 41 are in contact with connecting leads 12.

Also, as shown in FIGS. 8A and 8B, plate-like springs 41 are equally spaced from the side wall of lower and upper enclosures 18 and 39 up to the folded portions and edge portions of plate-like springs 41 are slightly above the upper plane of lead-frame 11 so that compressive distances of plate-like springs 41 may be about 0.5 mm, for example, when semiconductor laser device 8 is assembled in heat dissipation member 54.

Next, an assembling method of semiconductor laser assembly 8 will be described below. Semiconductor laser device 8 and heat dissipation member 54 are prepared. Semiconductor laser device 8 is inserted from the aperture on the side of steep slope plane 57b while being in contact with the inside walls of heat dissipation member 54. After semiconductor laser device 8 is received in a predetermined position, the edge portions of plate-like springs 41 are compressively in place at inside portions of protrusions 59. It is suitable for the use of a fork-like three-parallel-piece tool with thin edge portions to set the edge portions of plate-like springs 41 to the inside portions of protrusions 59. Since the laser emission edge portion of semiconductor laser device 8 is inserted into perforation 55, semiconductor laser device 8 is easily set at a predetermined position.

Semiconductor laser assembly 3 assembled by the method set forth above is such that upper enclosure 39 is in contact with gentle slope plane 57a and the edge portions of plate-like springs 41 are compressively held at protrusions 59 of heat dissipation member 54. As a result, repulsion of plate-like springs 41 pushes upper enclosure 39 against gentle slope plane 57a and force a reaction by gentle slope plane 57a in the direction of the lower portions, thereby keeping the bottom surface of lead-frame 11 in contact with inside bottom plane 56 of heat dissipation member 54.

The third embodiment obtains not only the same effects as the first or second embodiment but also heat dissipation characteristics more stabilized by positioning semiconductor laser device 8 at a predetermined place of heat dissipation member 54.

Fourth Embodiment

Figure 9:
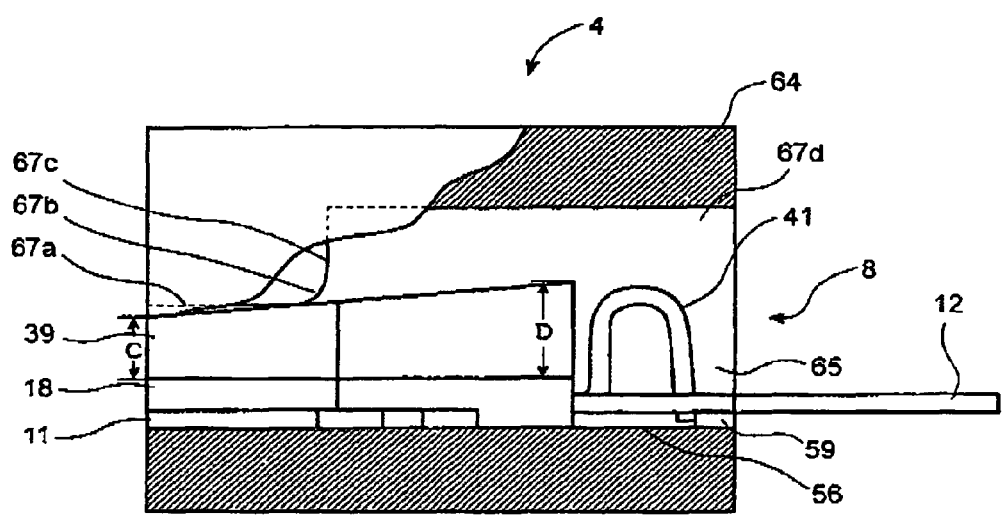
FIG. 9 is a schematic side view of a semiconductor laser assembly and its sectional view partially cut out along a heat dissipation member according to a fourth embodiment of the present invention.
Figure 10A:
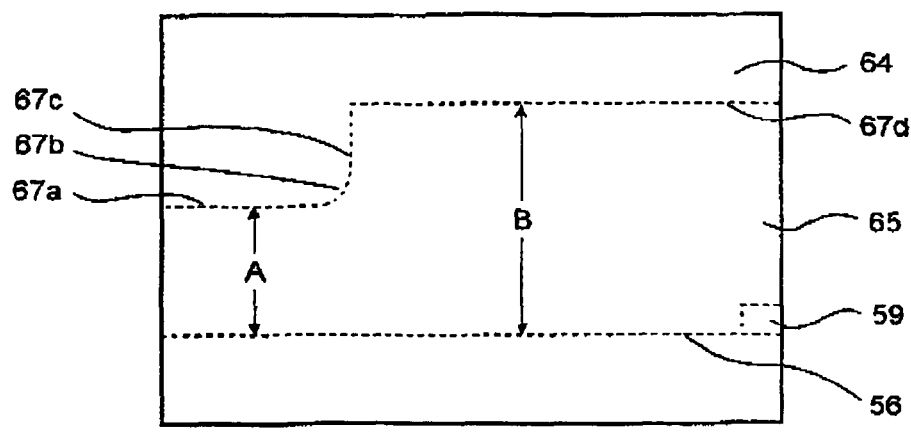
FIG. 10A is a side view of the heat dissipation member according to the fourth embodiment of the present invention.
Figure 10B:
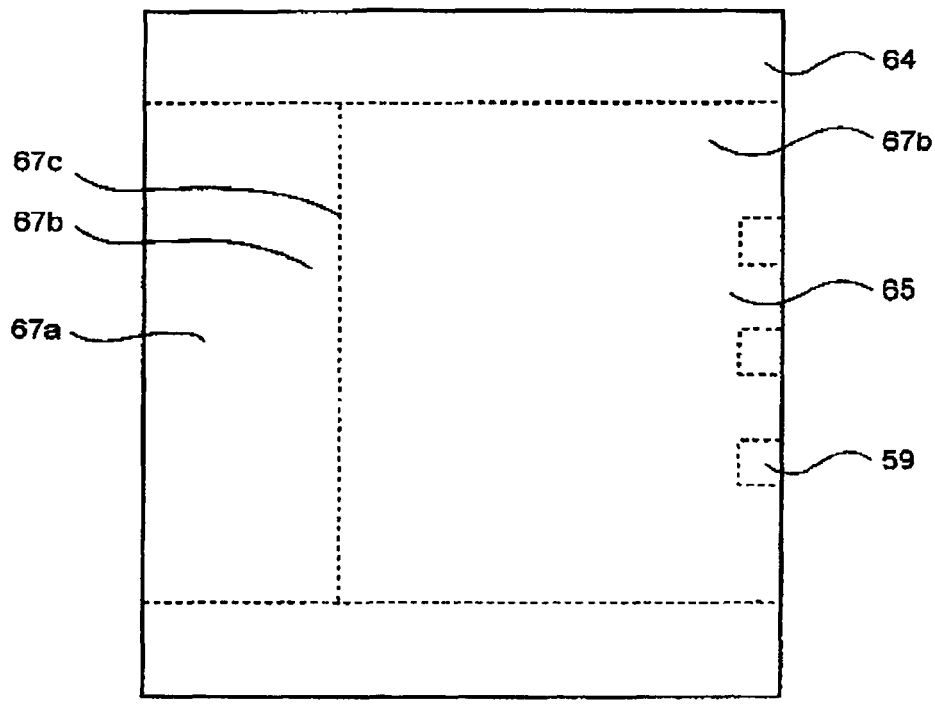
FIG. 10B is a plan view of the heat dissipation member shown in FIG. 10A.

A semiconductor laser device and a semiconductor laser assembly in accordance with the fourth embodiment of the present invention will be described below with reference to FIGS. 9, 10A and 10B. FIG. 9 is a schematic side view of semiconductor laser assembly 4 and its sectional view partially cut out along heat dissipation member 64. FIGS. 10A and 10B are side and plan views of heat dissipation member 64, respectively. Heat dissipation member 64 differs in the structure of a perforation from that of the third embodiment: inside top walls 67a and 67d with a step formed out of round and upright walls 67b and 67c. In the drawings, same reference numerals are put on the same components of semiconductor laser assembly 4 as those of first or second embodiment semiconductor laser assembly 1, 2 or 3 and descriptions about them are omitted.

As shown in FIG. 9, semiconductor laser assembly 4 is provided with semiconductor laser device 8 having plate-like springs 41, and heat dissipation member 64 in which tandem-cubic perforation 65 is defined to receive all semiconductor laser device 8 except connecting lead 12 extending from heat dissipation member 64. Dissipation member 64 has inside top, aide and bottom walls to define perforation 65. Plate-like springs 41 which are a reverse U-character in cross section are formed at the outside of upper enclosure 39 on the side of connecting leads 12. Repulsion of plate-like springs 41 pushes an outer surface of upper enclosure 39 of semiconductor laser device 8 into inside top walls 67a and 67b of heat dissipation member 64 and its reaction makes lead-frame 11 of semiconductor laser device 8 come in contact with inside bottom plane 56 of dissipation member 64. The laser emission direction is to the left and on the reverse direction with respect to connecting leads 12 shown in FIG. 9.

As shown in FIGS. 10A and 10B, heat dissipation member 64 is a metal heat radiator which has a large heat capacity in comparison with semiconductor laser device 8. Heat dissipation member 64 is substantially cubic in appearance. Perforation 65 is provided in heat dissipation member 64 with rectangular apertures at its entrance and exit. As shown in FIG. 10A, two sides of the aperture at the exit (left end) are the same in height as the laser emission edge portion defined by lead-frame 11 and lower and upper enclosures 18 and 39 while those of the aperture at the entrance (right end) are higher by 1-2 mm, for instance, than the other edge portion on the side of connecting leads 12 defined by lead-frame 11 and lower and upper enclosures 18 and 39. Those heights may be changed in accordance with the size of semiconductor laser device 8.

Since inside top walls 67a and 67d of heat dissipation member 64 are in parallel with inside bottom wall (plane) 56 as shown in FIG. 10A, perforation 65 of heat dissipation member 64 is "A" and "B" in height measured from inside bottom wall 56 to inside top walls 67a and 67d, respectively. Inside walls 67b and 67c connected between inside top walls 67a and 67d are round in cross section and perpendicular to inside top wall 67d, respectively.

Inside upright wall 67c exists in the inside from the entrance aperture (to the right direction) which is distant by ⅓-½ of the length of heat dissipation member 64 measured along the extending direction of connecting leads 12. The space defined between inside top and bottom wall 67a and 56 is enough to fix semiconductor laser device 8 by keeping edge portions of round wall 67b in contact with the outer top surface of upper enclosure 39 when semiconductor laser device 8 is inserted into perforation 65 by plate-like springs 41 so that the exit aperture plane of heat dissipation member 64 is consistent with the laser emission plane of semiconductor laser device 8. Inner bottom wall 56 is generally flat but provided with protrusions 59 close to the entrance aperture to stop plate-like springs 41 when semiconductor laser device 8 is assembled with heat dissipation member 64.

The thickness of heat dissipation member 64 measured from the top outer surface to the inside top wall ranges from 1-3 mm but may be changed to comply with requirements to receive semiconductor laser assembly 4 in use.

Next, an assembling method of semiconductor laser assembly 4 will be described below. Semiconductor laser device 8 and heat dissipation member 64 are prepared. The laser emission side of semiconductor laser device 8 which is "C" in height from lead-frame 11 is inserted from the entrance aperture on the side of inside top wall 67d while being in contact with the inside bottom wall 56 of heat dissipation member 64. After the rear portion opposite to the laser emission side of semiconductor laser device 8 which is "D" in height from lead-frame 11 is received in a predetermined position of heat dissipation member 64, the edge portions of plate-like springs 41 are compressively in place at inside portions of protrusions 59.

Semiconductor laser assembly 4 assembled by the fourth method set forth above is such that upper enclosure 39 is in contact with the front edge portions of inside round wall 67b and the edge portions of plate-like springs 41 are compressively held at protrusions 59 of heat dissipation member 64. As a result, repulsion of plate-like springs 41 pushes upper enclosure 39 against the front edge portions of inside round wall 67b and force a reaction by the front edge portions of inside round wall 67b in the direction of the lower portions, thereby keeping the bottom surface of lead-frame 11 in contact with inside bottom plane 56 of heat dissipation member 64.

The fourth embodiment obtains not only the same effects as the first, second Or third embodiment but also is capable of smoother positioning of semiconductor laser device 8 at a predetermined place of heat dissipation member 54 when semiconductor laser device 8 is inserted, and moved, into perforation 65 because perforation 65 has enough space to receive semiconductor laser device 8.

Fifth Embodiment

Figure 11:
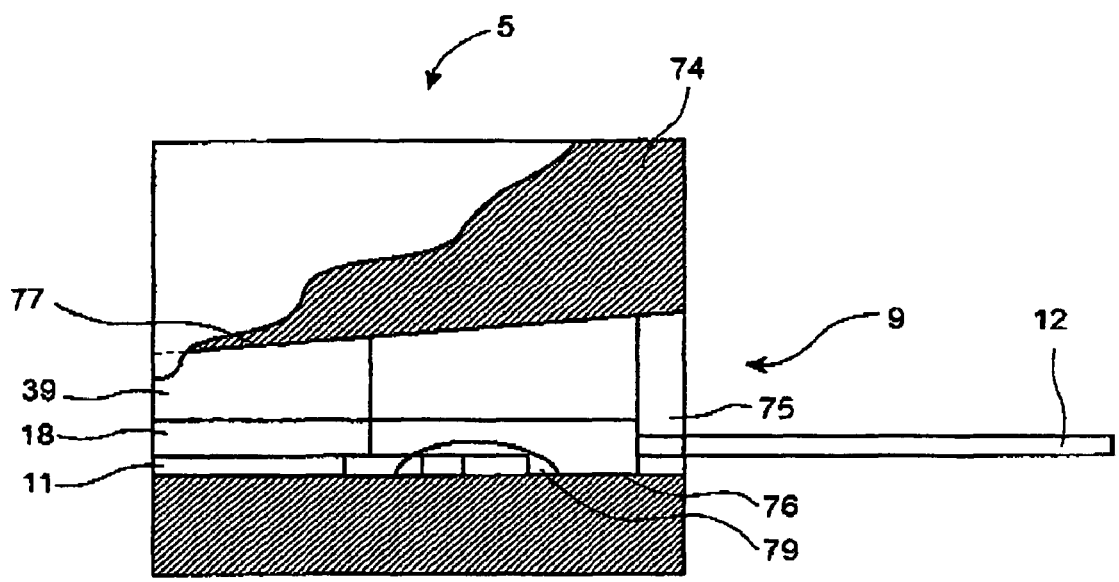
FIG. 11 is a schematic side view of a semiconductor laser assembly and its sectional view partially cut out along a heat dissipation member according to a fifth embodiment of the present invention.
Figure 12A:
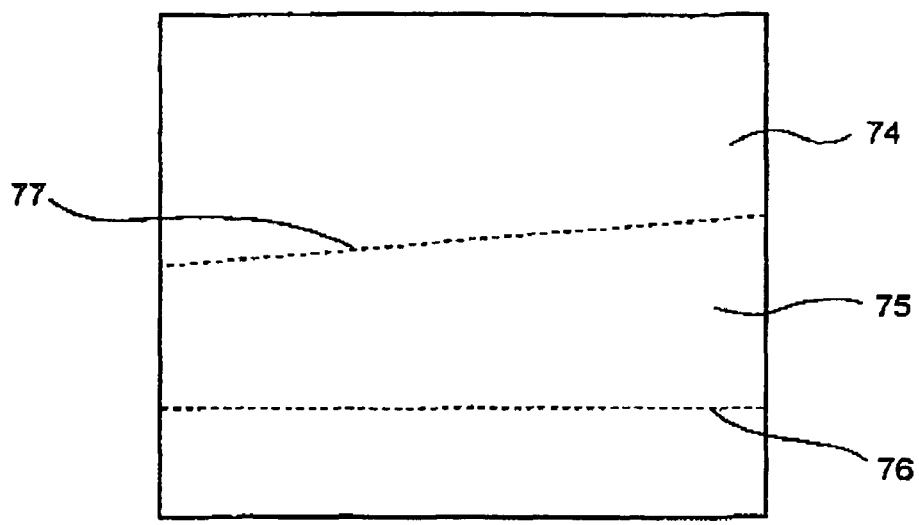
FIG. 12A is a schematic side view of the heat dissipation member according to the fifth embodiment of the present invention.
Figure 12B:
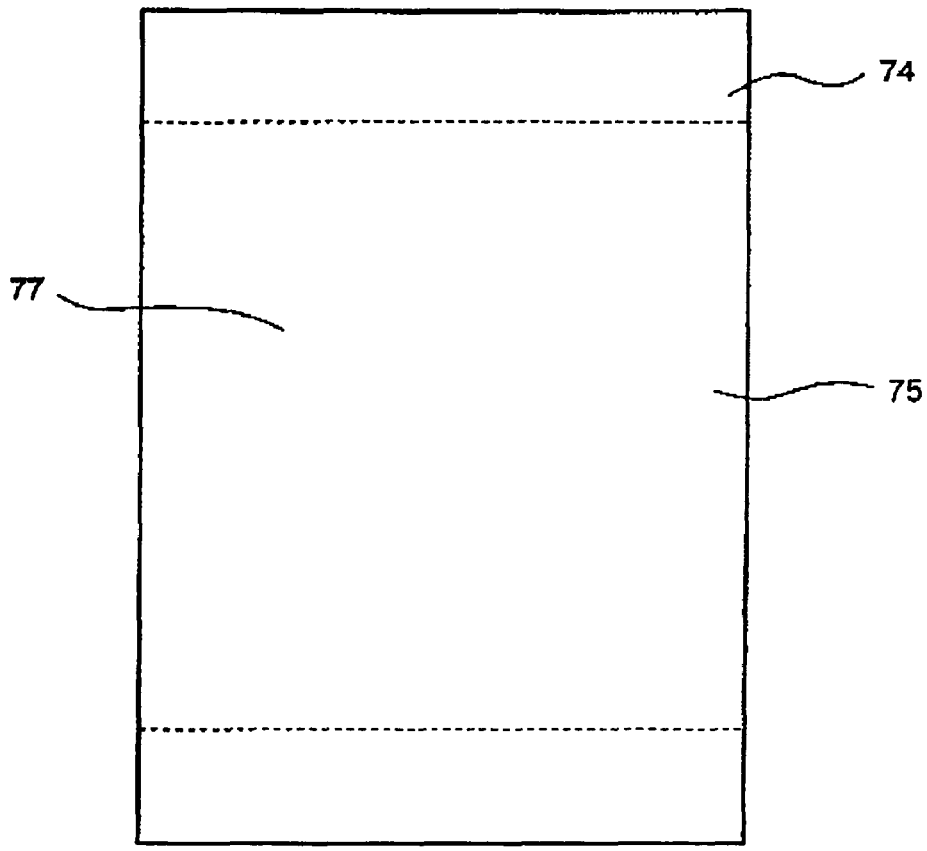
FIG. 12B is a plan view of the heat dissipation member shown in FIG. 12A.

A semiconductor laser device and a semiconductor laser assembly in accordance with the fifth embodiment of the present invention will be described below with reference to FIGS. 11, 12A-12B and 13. FIG. 11 is a schematic side view of semiconductor laser assembly 5 with a sectional view partially cut out along heat dissipation member 74. FIGS. 12A and 12B are schematic aide and plan views of heat dissipation member 74, respectively. Heat dissipation member 74 which differs in structure from that of the first through fourth embodiments is not provided with a plate-like spring although heat dissipation member 74 receives semiconductor laser device 9. In the drawings, same reference numerals are put on the same components of semiconductor laser assembly 4 as those of first or second embodiment semiconductor laser assembly 1, 2, 3 or 4 and descriptions about them are omitted.

As shown in FIG. 11, semiconductor laser assembly 5 is provided with semiconductor laser device 9 having upper sloped and lower enclosures 39 and 18, and heat dissipation member 74 in which cubic perforation 75 is defined to receive all semiconductor laser device 9 except connecting lead 12 extending from heat dissipation member 64. Dissipation member 74 has inside sloped top, side and bottom walls to define perforation 75. When heat dissipation member 74 fully receives semiconductor laser device 9, lead-frame 11 is fixed by an adhesive while the outer surface of upper enclosure 39 of semiconductor laser device 8 pushes inside second top wall 77b of heat dissipation member 74 for its reaction to make the outer surface of lower enclosure 18 of semiconductor laser device 9 come in contact with inside bottom plane 76 of the inside bottom wall of dissipation member 64. The laser emission direction is to the left and in the reverse direction with respect to connecting leads 12 shown in FIG. 11. Major portions of connecting leads 12 extend from heat dissipation member 74.

As shown in FIG. 12, heat dissipation member 74 is a metal heat radiator which has a large heat capacity in comparison with semiconductor laser device 9. Heat dissipation member 74 is substantially cubic in appearance. Perforation 75 is provided in heat dissipation member 64 with rectangular apertures at its entrance and exit.

Inside sloped top wall 77 of heat dissipation member 74 is decreasingly sloped from the entrance aperture to the exit aperture Inside sloped top wall 77 is consistent with the outer sloped surface of upper enclosure 39. The entrance and exit apertures are enough in size to receive lead-frame 11 and lower and upper enclosures 18 and 39 while lead-frame 11 is kept in contact with bottom wall 76 of heat dissipation member 74.

Figure 13:
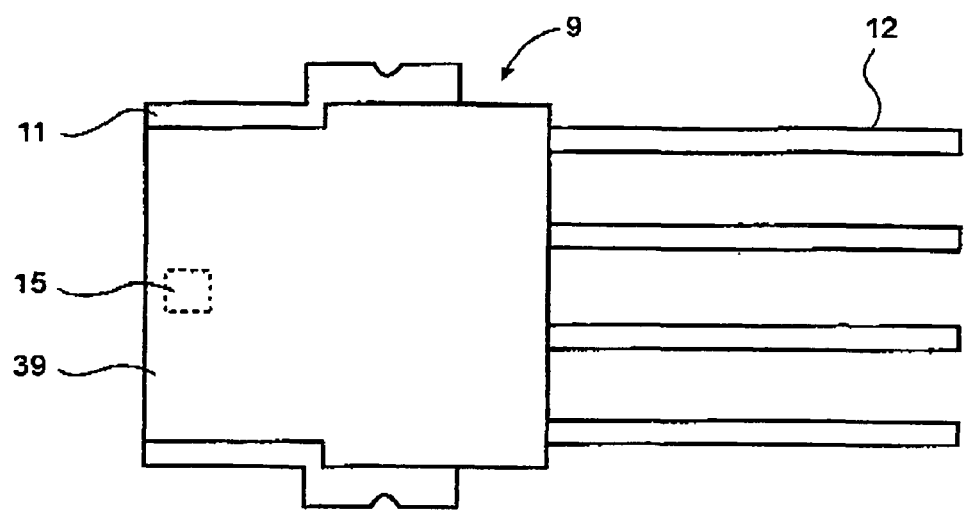
FIG. 13 is a plan view of the semiconductor laser device according to the fifth embodiment of the present invention.
Figure 14:
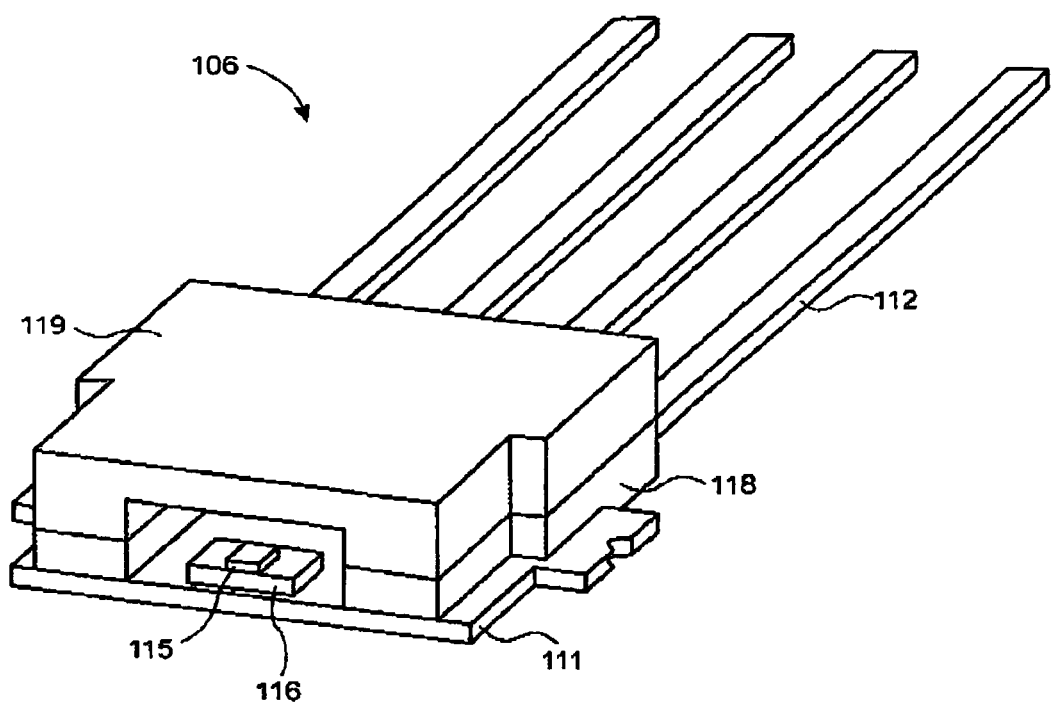
FIG. 14 is a perspective view of a conventional semiconductor laser device.

As shown in FIG. 13, semiconductor laser device 9 is the same in structure as semiconductor laser device 8 except plate-like springs 41 provided for semiconductor laser device 8.

Next, an assembling method of semiconductor laser assembly 5 will be described below. Semiconductor laser device 9 and heat dissipation member 74 are prepared. The laser emission side of semiconductor laser device 9 is inserted from the entrance aperture of heat dissipation member 74 until semiconductor laser device 9 except connecting leads 12 is fully received, i.e., the outer top and bottom surfaces of semiconductor laser device 9 are closely in contact with the inside upper and bottom walls 77 and 76 of heat dissipation member 64. After semiconductor laser 9 is received in a predetermined position of heat dissipation member 74, semiconductor laser device 9 is preliminarily fixed by applying a spring force with a tool (not shown), for instance. Adhesive 79 made of epoxy resin, for example, is then injected with injectors or the like into a place where lead-frame 11 is fixed with bottom wall 76. The tool is removed after adhesive 79 is hardened. There are other fixation means of semiconductor laser device 9 than adhesive 79. Cut-out portions or holes may be made through inside upper sloped wall 77 for screws or pins to fix lead-frame 11 on inside upper sloped wall 77.

As shown in FIG. 11, upper enclosure 39 and lead-frame 11 of semiconductor laser device 9 assembled into semiconductor laser assembly 4 by the fourth method set forth above are in contact with inside sloped top wall 77 and inside bottom wall 76, respectively. This is due to the fixation by adhesive 79 so that inside sloped top wall 77 pushes upper enclosure 39 and force a reaction by inside sloped top wall 67b in the downward direction, thereby keeping the bottom surface of lead-frame 11 in contact with inside bottom wall 76 of heat dissipation member 64.

The fifth embodiment obtains not only the same stabilized heat dissipation effect as the first, second, third or fourth embodiment but also the number of components for semiconductor laser device 8 can be reduced. Further, semiconductor laser device 9 can be set at a predetermined place of heat dissipation member 54, so that heat dissipation is more stabilized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

Although the dual-wavelength lasing-type semiconductor laser device is described by way of example but a single wavelength lasing-type semiconductor laser device can be also used to reduce the number of terminals for leads.

The perforation of the heat dissipation member is made in a single metal body or in a plurality of assembled metal components.

The number of the plate-like springs in the embodiments except the fifth one may be single or equal to or more than three in the case that the outer bottom surface of the lead-frame of the semiconductor laser device is uniformly in contact with the inside bottom wall of the heat dissipation member. Although the plate-like spring is a U-character in cross section, it may be an L-, V-, S- or Z-character in cross section, arch-like, circular, elliptic or in combination of those configurations including a C-character.

Although the two different inside-sloped-top walls and single sloped-top wall of the heat dissipation member are shown in the third and fifth embodiments, respectively, more than two different inside-sloped-top walls may also be used. Further, a combination of inside top walls which are sloped and in parallel with the inside bottom wall may be used for the inside top walls.

Although the plate-like springs of the third or fourth embodiment are downwardly bent and their edge portions are engaged with the protrusions provided on the inside bottom wall, they may be upwardly bent and their portions may be engaged with the protrusions provided on the inside top wall.

The following semiconductor laser devices may be applied to the present invention. A semiconductor laser device includes a semiconductor laser element, a lead-frame on which the semiconductor laser element is provided, a semiconductor-laser-element enclosure with an aperture for emitting laser beams from the semiconductor laser element, a spring provided outside the enclosure and connected with the lead-frame, and lead terminals provided outside the enclosure on the side reversed to the aperture.

In addition, the spring of the semiconductor laser device set forth immediately above can be made by bending plates while keeping parallel with an extending direction of the lead terminals.

Further, the spring of the semiconductor laser device set forth immediately above can be made by bending plates while keeping in perpendicular to an extending direction of the lead terminals and parallel with the lead-frame.

What we claim is:

1. A semiconductor laser assembly comprising:
   a semiconductor laser device including a semiconductor laser element, a lead-frame on which the semiconductor laser element is provided, an enclosure with an opening to project laser beams from the semiconductor laser element to enclose the semiconductor laser element and a spring member of a plate like material; and
   a heat dissipation member having inside walls to define a perforation to receive the semiconductor laser device,
   wherein the spring member is provided with a holding portion extending along an outer surface of the enclosure from the lead-frame and is provided with spring portions of a bent structure with spring to push one of the inside walls of the heat dissipation member and the semiconductor laser device by repulsion, so that the semiconductor laser device is configured to further push another one of the inside walls positioned on a back side of the enclosure to hold the semiconductor laser device in the heat dissipation member, and
   wherein the holding portion holds the back side and side walls of the enclosure, the holding portion is folded to direct the spring portions of the bent structure to the one of the inside walls of the heat dissipation member.

2. A semiconductor laser assembly according to claim 1, wherein the heat dissipation member is made of metal which is larger in heat capacity than the semiconductor laser device.

3. A semiconductor laser assembly according to claim 1, wherein the spring member makes a back portion of the outer surface of the enclosure of the semiconductor laser device come in contract with the another one of the inside walls corresponding to the back portion of the outer surface of the enclosure so that the heat dissipation member holds the semiconductors laser device.

4. A semiconductor laser assembly according to claim 1, wherein the spring member holds the enclosure of the semiconductor laser device.

5. A semiconductor laser assembly according to claim 1, wherein the holding portion is extended along a top surface of the enclosure and the spring portion is formed by bending the holding portion at a point corresponding to about $\frac{2}{5}$ of a width of the enclosure.

6. A semiconductor laser assembly according to claim 1, wherein the spring member is a pair of springs provided from both side wall through a top wall of the enclosure.

7. A semiconductor laser assembly according to claim 1, wherein the spring member is connected to the lead frame.

8. A semiconductor laser assembly according to claim 1, wherein the holding portion of the spring member extends from a portion at the back side of the enclosure and the spring portion is provided above a top wall of the spring member.

9. A semiconductor laser assembly according to claim 8, wherein the spring member has not less than two sets of the holding portions and the spring portions provided at the back side portion of the enclosure with respect to a projection direction of the laser beams.

10. A semiconductor laser assembly comprising:
    a semiconductor laser device including a semiconductor laser element, a lead-frame of a plate like material and an enclosure to enclose the semiconductor laser element, the enclosure having an opening for projecting laser beams from the semiconductor laser;
    a heat dissipation member having inside walls to define a perforation to receive the semiconductor laser device;
    a protrusion being provided at an edge portion of one of the inside walls defining the perforation of the heat dissipation member; and
    a spring member of a plate-like material having a U-shaped cross section with spring,
    wherein the spring member pushes the protrusion and the enclosure of the semiconductor laser device by repulsion, so that the semiconductor laser device is configured to further push the heat dissipation in member to hold the semiconductor laser device in the heat dissipation member.

11. A semiconductor laser assembly according to claim 10 wherein the spring member makes an outer surface of the enclosure of the semiconductor laser device come in contact with the one of the inside walls, so that the heat dissipation member holds the semiconductor laser device.

12. A semiconductor laser assembly according to claim 10, wherein the heat dissipation member is made of metal which is larger in heat capacity than the semiconductor laser device.

13. A semiconductor laser assembly according to claim 3, wherein the spring member has a bent portion at a back side portion of the enclosure with respect to a projection direction of the laser beams and an edge portion of the spring member is held at one of the inside walls.

14. A semiconductor laser assembly according to claim 3, wherein the spring member has not less than two sets of the bent portions and the edge portions.

15. A semiconductor laser assembly according to claim 10, wherein the one of the inside walls of the heat dissipation member and the outer surface of the enclosure of the semiconductor laser device are sloped so that the semiconductor laser device is guided and set in the perforation of the heat dissipation member.

16. A semiconductor laser assembly according to claim 10, wherein the inside walls of the heat dissipation member have top, bottom and side walls, the inside top walls have low and high portions which are A and B in height and define a step between the low and high portions, the enclosure of the semiconductor laser device has low and high portions which are C and D in height, and the heights are satisfied with a relationship of C<A<D<B so that the semiconductor laser device is held at the low portion of the heat dissipation member.

17. A semiconductor laser assembly comprising:
   a semiconductor laser device including a semiconductor laser element, a lead-frame and an enclosure with an opening for projecting laser beams from the semiconductor laser element to enclose the semiconductor laser; and
   a heat dissipation member having inside walls to define a perforation to receive the semiconductor laser device;
   wherein one of the inside walls of the heat dissipation member and a corresponding outer surface of the enclosure of the semiconductor laser device are sloped, and the semiconductor laser device is fixed to the heat dissipation member by one of the adhesives, screws and pins to contact the sloped one of the inside walls of the heat dissipation member with the corresponding sloped outer surface of the enclosure.

18. A semiconductor laser assembly according to claim 17, wherein the heat dissipation member is made of metal which is larger in heat capacity than the semiconductor laser device.

19. A semiconductor laser assembly according to claim 10, wherein a portion of one of the inside walls of the heat dissipation member and a corresponding portion of an outer surface of the enclosure of the semiconductor laser device are sloped and contact with each other, and another one of the inside walls of the heat dissipation member is pushed by the spring member via the semiconductor laser device.

20. A semiconductor laser assembly according to claim 19, wherein the one of the inside walls of the heat dissipation member has gentle and steep slopes.

21. A semiconductor laser assembly according to claim 10, wherein one of the inside walls of the heat dissipation member has a step and an outer surface of the enclosure, corresponding to one of the inside walls of the heat dissipation member, is sloped and contact with each other, and another one of the inside walls of the heat dissipation member is pushed by the spring member via the semiconductor laser device.

* * * * *